US008929415B2

United States Patent
Kim et al.

(10) Patent No.: US 8,929,415 B2
(45) Date of Patent: Jan. 6, 2015

(54) PHOTONIC CRYSTAL CAVITIES AND RELATED DEVICES AND METHODS

(71) Applicant: California Institute of Technology, Pasadena, CA (US)

(72) Inventors: Seheon Kim, Pasadena, CA (US); Axel Scherer, Barnard, VT (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/095,372

(22) Filed: Dec. 3, 2013

(65) Prior Publication Data

US 2014/0301418 A1  Oct. 9, 2014

Related U.S. Application Data

(62) Division of application No. 12/711,111, filed on Feb. 23, 2010, now Pat. No. 8,670,471.

(60) Provisional application No. 61/208,801, filed on Feb. 27, 2009.

(51) Int. Cl.

| | |
|---|---|
| H01S 3/14 | (2006.01) |
| H01S 3/093 | (2006.01) |
| H01S 5/00 | (2006.01) |
| H01S 5/183 | (2006.01) |
| B82Y 20/00 | (2011.01) |
| H01L 31/0352 | (2006.01) |
| H01S 5/04 | (2006.01) |
| H01S 5/34 | (2006.01) |
| H01L 33/00 | (2010.01) |
| H01S 5/10 | (2006.01) |

(52) U.S. Cl.
CPC ............... *H01S 5/183* (2013.01); *B82Y 20/00* (2013.01); *H01L 31/0352* (2013.01); *H01L 31/035281* (2013.01); *H01S 5/041* (2013.01); *H01S 5/34* (2013.01); *H01L 33/0045* (2013.01); *H01L 2933/0083* (2013.01); *H01S 5/105* (2013.01); *H01S 5/18319* (2013.01); *H01S 5/18327* (2013.01); *H01S 5/18352* (2013.01); *H01S 5/3412* (2013.01); *Y02E 10/50* (2013.01)
USPC ........................ 372/39; 372/43.01; 372/72

(58) Field of Classification Search
USPC ............... 372/39, 72, 81, 43.01; 385/129
See application file for complete search history.

(56) References Cited

U.S. PATENT DOCUMENTS

| | | | | |
|---|---|---|---|---|
| 6,868,103 | B2 * | 3/2005 | Gerard et al. | 372/32 |
| 2005/0158898 | A1 * | 7/2005 | Scherer | 438/29 |

OTHER PUBLICATIONS

Non-Final Office Action mailed on Jun. 4, 2013 for U.S. Appl. No. 12/711,111, filed Feb. 23, 2010 in the name of California Institute of Technology.
Seo, M.K., et al., Low Threshold Current Single-Cell Hexaploe Mode Photonic Crystal Laser, Applied Physics 1 Letters 2007, 90:171122-1-171122-3.
Final Office Action mailed on Sep. 13, 2013 for U.S. Appl. No. 12/711,111, filed Feb. 23, 2010 in the name of California Institute of Technology.
Notice of Allowance mailed on Nov. 7, 2013 for U.S. Appl. No. 12/711,111, filed Feb. 23, 2010 in the name of California Institute of Technology.

* cited by examiner

*Primary Examiner* — Armando Rodriguez
(74) *Attorney, Agent, or Firm* — Steinfl & Bruno LLP

(57) ABSTRACT

Photonic crystal cavities and related devices and methods are described. The described cavities can be used as lasers, photovoltaic sources, and single photon sources. The cavities can be both optically and electrically pumped. A fabrication process of the cavities is also described.

6 Claims, 16 Drawing Sheets

350

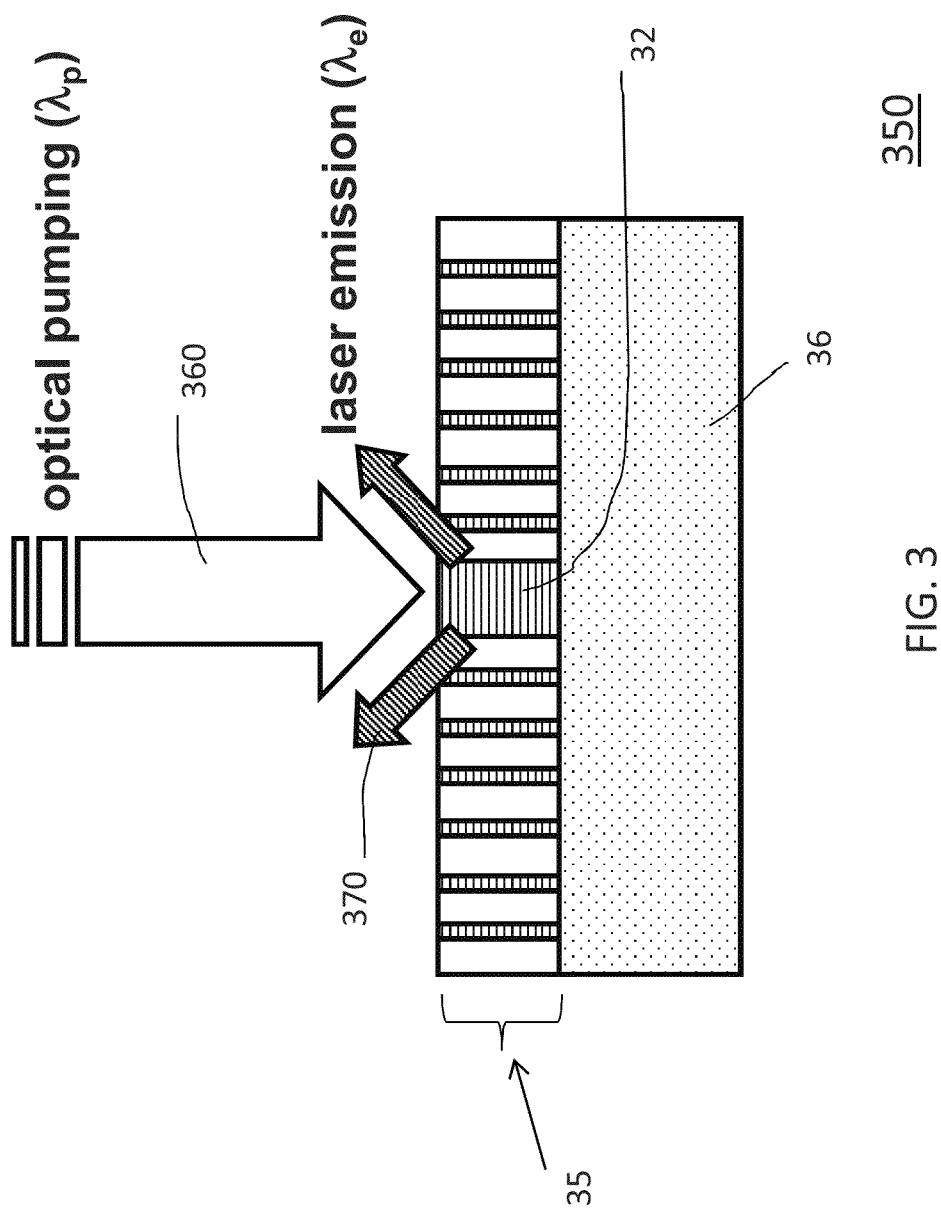

PHOTONIC CRYSTAL CAVITIES AND RELATED DEVICES AND METHODS

CROSS REFERENCE TO RELATED APPLICATIONS

The present application is a divisional of U.S. patent application Ser. No. 12/711,111 filed on Feb. 23, 2010 and incorporated herein by reference in its entirety, which in turn, claims priority to U.S. Provisional Application No. 61/208,807 filed on Feb. 27, 2009, which is incorporated herein by reference in its entirety.

STATEMENT OF GOVERNMENT GRANT

The U.S. Government has certain rights in this invention pursuant to Grant No. FA955-04-1-0434 awarded by Air Force (AFOSR) and Grant No. W911NF-07-1-0277 awarded by ARO—US Army Robert Morris Acquisition Center.

FIELD

The present disclosure relates to optical cavities and lasers. More in particular, the present disclosure relates to photonic crystal cavities and related devices and methods.

BACKGROUND

Semiconductor lasers are components frequently used in modern optical communication systems. Semiconductor lasers can be directly operated and modulated by external current sources. By employing well-established nanofabrication techniques including photo- (electron beam-) lithography, dry etching, and wet-chemical etching processes, a dense array of some of the high performance semiconductor lasers including vertical cavity surface emitting lasers (VCSELs) can be fabricated on a single chip. In particular, for long distance fiber optic communications, semiconductor lasers that emit 1.3 µm or 1.5 µm in the wavelength are more attractive.

It has been well established that cavities having both sufficiently low optical loss and submicron-sized mode volume can be used to greatly enhance the spontaneous emission coupling factor ($\beta$), which is defined as a fraction of a number of photons couples into a specific optical mode of interest (laser mode) over a total number of all the spontaneously emitted photons. The threshold of a laser, which is one important figure of merit for a given semiconductor laser, is closely related to $\beta$. It is intuitively clear that, the so called thresholdless laser may be achieved by utilizing a laser cavity with $\beta=1$. VCSELs are known to have relatively small mode volume compared with other semiconductor lasers, a typical $\beta$ for VCSELs on the order of $\sim 10^{-4}$. Furthermore, it has been recently shown that utilizing a large $\beta > 0.1$ cavity may enable a new pathway to achieve ultra-high modulation speed far greater than 100 Gb/s (see, for example, reference 10). Conventional semiconductor lasers can be modulated within an approximate range of 20 to 40 Gb/s.

A photonic crystal which consists of a periodic arrangement of (low and high) dielectric materials has been proved to be very useful to achieve submicron-sized optical cavities with a large $\beta > 0.1$ (see, for example, references 3, 9, and 14). The most widely adopted geometry in the field of photonic crystal lasers is a photonic crystal slab structure that is made of an optically thin dielectric slab with a periodic arrangement of perforated air-holes. Spatially localized electric-field intensity distributions (optical resonant modes) may be formed at around a crystal 'defect region', which has slightly higher effective refractive index than its outside region. To achieve laser operation, a certain type of gain materials such as multiple quantum wells can be inserted in the middle of the slab during the epitaxial growth process.

The first semiconductor photonic crystal slab defect laser was operated by optical pumping at liquid nitrogen temperature (see, for example, reference 2). However, thereafter, much progress has been made to achieve optimized cavity quality factors (Q) along with the rapid development of numerical simulation techniques for electrodynamics such as the finite-difference time-domain (FDTD) method. Nowadays the state of the art photonic crystal cavity design enables a Q factor exceeding over 1 million (see, for example, reference 18) and very recently, room-temperature continuous-wave operation by optical pumping was reported from a certain type of defect design (see, for example, reference 7, 8, and 14).

Until recently, it has been believed that the semiconductor photonic crystal slab that has, normally, a high refractive index (n>3) should be suspended in air to support reasonably high Q factors. A certain form of electrically-pumped photonic crystal lasers were proposed and demonstrated, in which a submicron-sized dielectric post is formed as a current path (see, for example, reference 9). The record threshold current from such electrically-pumped lasers is approximately 100 µA (see, for example, reference 19). Such device has a resistance of more than 2 k$\Omega$ and a thermal characteristic such that a resulting maximum continuous operation time of the device is typically within 10 ns. Moreover, cooling down such device (e.g., for about 1 µs) for the next operation involves shutting off the device.

FIG. 1A shows a top view of a known photonic crystal design. Circular background air-holes (15) arranged in a triangular lattice (11) in a semiconductor slab serve as photonic band-gap material, by which light propagation in the horizontal directions within a certain frequency range is prohibitive (see, for example, reference 1). As shown in FIG. 1B, by forming a defect region (14) in a perfectly periodic photonic crystal, strong light localization is enabled. The exemplary defect region (14) of FIG. 1B is formed by pushing away six nearest air-holes from a center of the defect region (14) and reducing radii of the six air-holes to generate modified air-holes (12, 13) (see, for example, reference 3). Structural parameters related to the photonic crystal of FIG. 1B are shown in FIG. 1C. Radii of air-holes (12, 13) are denoted respectively by '$r_m$' and '$r_m + \Delta$'. A lattice constant 'a' is also shown in FIG. 1C and each of the background air-holes (15) has a radius denoted by 'r'. Typically the radii 'r' and '$r_m$' are chosen to be approximately equal to 0.35 a and 0.25 a respectively.

Referring to FIGS. 1A-C, several resonant modes having different eigen-frequencies can coexist in the same defect geometry. They are denoted by the dipole (doubly degenerate), the quadrupole (doubly degenerate), the hexapole (non-degenerate), and the monopole (non-degenerate) modes, depending on their rotational symmetries (see, for example, reference 3). Full vectorial 3-D numerical simulations, such as FDTD can be used to understand properties of the photonic crystal cavity modes (see, for example, reference 4, 13). One may break the perfect six-fold symmetry by slightly increasing the two air-holes facing each other in an x direction, shown with an arrow (17) in FIG. 1A (see, for example, reference 5). This type of perturbation may be employed to break the inherent degeneracy of modes and/or to control the direction of linear polarizations.

One of the important figure of merits in the description of a photonic crystal cavity is a cavity quality factor Q. Thus, a better optical confinement means a higher Q factor. In all 2-D photonic crystal slab structures, major optical losses occur in the vertical directions, through the top and bottom of the slab. This incomplete vertical confinement may be understood by the notion of the total-internal-reflection (see, for example, reference 6). Therefore, the best vertical confinement may be obtained by maximizing the refractive index contrast between the slab material and surrounding media (claddings). For telecom wavelength (1.3 µm or 1.55 µm) applications, InGaAsP (Indium Gallium Arsenic Phosphate) material system may be employed as a slab material and it has a high refractive index of approximately 3.45. Therefore, the use of air as a cladding material seems to be natural starting point when one wants to optimize Q factors.

To improve thermal characteristics of 2-D photonic crystal slab devices, the use of silica or sapphire as a bottom cladding material has been proposed and demonstrated (see, for example, references 7-8). The Q factor obtained using such material is around 2000. The mentioned materials are electrical insulators.

A light extraction efficiency of 50% can be achieved using conventional photonic crystal slab nanolasers (see, for example, references 2, 3, 9, 10, and 12) due to the vertically symmetric slab geometries. Some of the plasmonic cavity designs have been drawn much attention, recently (see, for example, references 15 and 16). Due to metal loss, radiation efficiencies below 10% can be achieved with such designs.

SUMMARY

According to a first aspect, a photonic crystal cavity is provided, comprising: a photonic crystal slab comprising a plurality of air-holes arranged periodically and a defect region; and a cladding underlying the photonic crystal slab.

According to a second aspect, an optically-pumped photonic crystal laser is provided, comprising: a pump laser; and the photonic crystal cavity according to the first aspect, wherein the photonic crystal slab further comprises a gain medium, wherein in an operative condition, the pump laser emits light onto the defect region of the photonic crystal cavity to create carriers confined in the gain medium to generate light.

According to a third aspect, an electrically-pumped photonic crystal laser is provided, comprising: the photonic crystal cavity according to the first aspect, wherein the photonic crystal slab further comprises a gain medium ; and a top electrode above the photonic crystal slab, wherein during operation, a voltage difference between the top electrode and the cladding is applied to create carriers confined in the gain medium to generate light.

According to a fourth aspect, a method for creating a desired far field emission profile from a laser is provided, comprising: providing the electrically-pumped photonic crystal laser according to the third aspect, wherein a thickness of the photonic crystal lab is set to generate the desired far field emission profile; and applying a voltage difference between the top electrode and the cladding to generate the desired far field emission.

According to a fifth aspect, a single photon source is provided, comprising: the photonic crystal cavity according to the first aspect, further comprising a quantum dot within the defect region; and a current source, wherein during operation, a current supplied by the current source excites one electron-hole pair from the quantum dot, the electron-hole pair recombining and generating a single photon.

According to a sixth aspect, a photovoltaic device is provided, comprising: the photonic crystal cavity according to the first aspect, further comprising two terminals connected with a top electrode overlying the photonic crystal slab and the cladding, wherein during operation, the photonic crystal slab is illuminated to generate a voltage difference across the two terminals.

According to a seventh aspect, a method for generating a photovoltaic voltage is provided, comprising: providing the photonic crystal cavity according to the first aspect, forming a top electrode on the photonic crystal slab of the photonic crystal cavity; illuminating the photonic crystal slab of the photonic crystal cavity; and generating a photovoltaic voltage difference across the top electrode and the cladding.

According to an eighth aspect, a method for fabricating a photonic crystal cavity is provided, comprising: forming a photonic crystal slab on a first substrate, the crystal slab comprising a top layer, a bottom layer and a middle layer between the top layer and bottom layer, the middle layer comprising a gain medium; forming an insulating layer comprising an aperture above of the photonic crystal slab; forming a first top layer above the insulating layer; providing a second substrate; forming a second top layer on the second substrate; bonding the first top layer to the second top layer; partially removing the first substrate; forming a top electrode above the photonic crystal slab; patterning the photonic crystal slab; and etching the photonic crystal slab to define air-holes and a defect region.

According to an ninth aspect, a method for generating linearly polarized light is provided, comprising: providing the electrically-pumped photonic crystal laser according to the third aspect, wherein: the plurality of air-holes are arranged in periodic triangular lattices and the defect region is surrounded by six adjacent air-holes, the six adjacent air-holes forming a regular hexagon, wherein: four of the six adjacent air-holes forming a rectangle have each a first radius; and two of the six adjacent air-holes have a second radius larger than the first radius; and applying a voltage difference between the top electrode and the cladding to create carriers confined in the defect region to generate linearly polarized light.

Further aspects of the present disclosure are shown in the descriptions, drawings and claims of the present application.

BRIEF DESCRIPTION OF FIGURES

FIG. 3 shows a schematic diagram illustrating an application of the embodiment of FIGS. 2A-B.

DETAILED DESCRIPTION

Throughout the present disclosure the term 'defect region' intends to indicate a section of a perfectly periodic photonic crystal wherein light localization is enabled, the section being formed as a result of breaking the periodicity of the air-holes of the photonic crystal. Also, the cavity quality factor Q is defined herein as $\omega\tau$, where $\omega$ is the angular frequency of a mode (=$2\pi f$, the frequency f in Hertz) within the cavity and $\tau$ is the lifetime of the cavity in second (see, for example, reference 4).

In what follows, photonic crystal cavities and related applications and fabrication methods will be described in accordance with embodiments of the present disclosure. Throughout the present disclosure, the term 'photonic crystal' intends to indicate a structure comprising a periodic arrangement of dielectrics and/or metals. According to several embodiments of the present disclosure, the described cavities comprise a photonic crystal slab directly bonded onto a metal cladding. The metal cladding provides conduction pathways for both current and heat flows. Furthermore, the metal layer can be used to enhance vertically emitted output power, enabling unidirectional vertical emission of photonic crystal lasers.

Figure 2A:
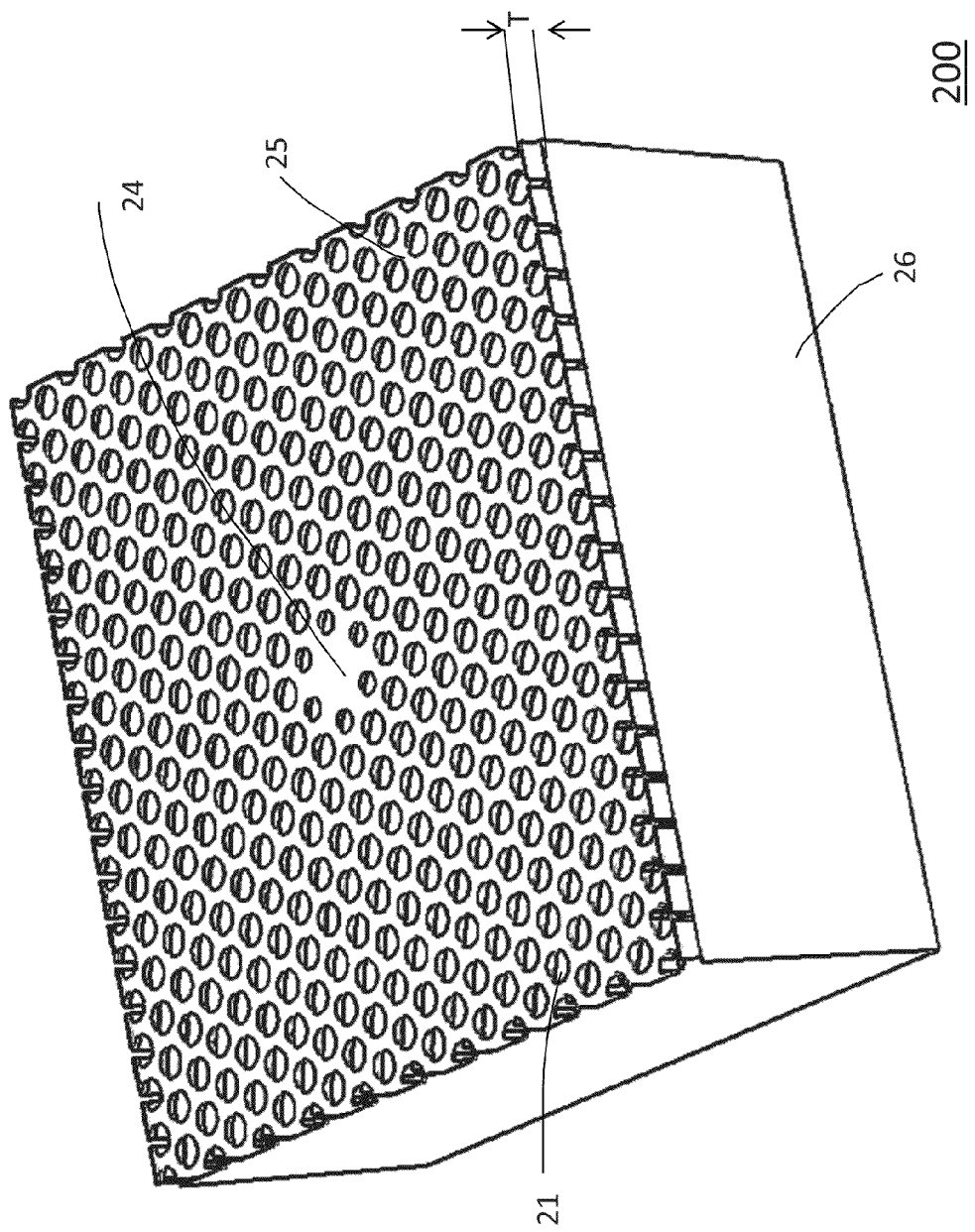
FIGS. 2A-B show respectively a partial perspective view and side cross-sectional view of a photonic crystal vertical emitting cavity according to an embodiment of the present disclosure.
Figure 2B:
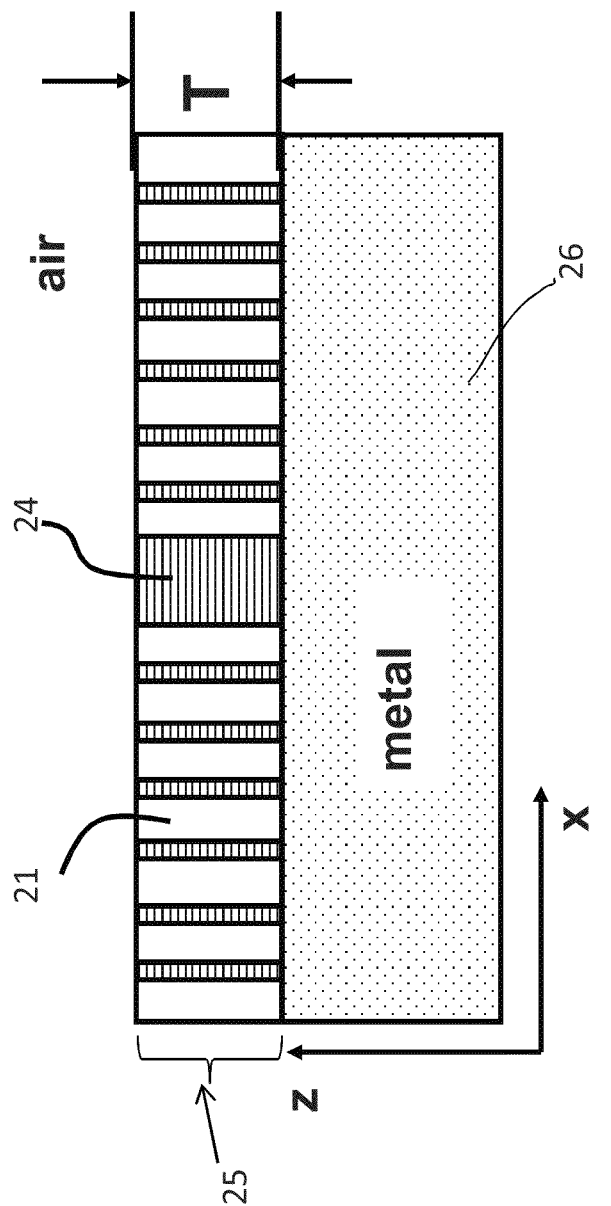

FIGS. 2A-B show respectively a partial perspective view and a side cross-sectional view of a photonic crystal vertical emitting cavity (200) in accordance with an embodiment of the present disclosure. The photonic crystal vertical emitting cavity (200) comprises a photonic crystal slab (25) overlying a cladding (26). The photonic crystal slab (25) has a thickness of 'T' and comprises air-holes (21) and a defect region (24). According to an embodiment of the present disclosure, the cladding (26) is made of metal. The person skilled in the art will appreciate that metal is highly thermal conductive which results in an improved thermal characteristics of photonics crystal cavities. Moreover, due to high electrical conductivity, metal is an excellent candidate to be used as part of electrical-pumped photonic crystals. The person skilled in the art will also appreciate that metal is highly reflective. As an example, with gold, reflectivity over 98% for a wavelength range of 1.3 μm to 1.55 μm can be achieved. Furthermore, in applications where the photonic crystal vertical emitting cavity (200) is used as a laser, a metal cladding can block a downward (e.g., from the photonic crystal slab (25) towards the cladding (26)) emitted laser power and re-direct it to an upward direction (e.g., from the cladding (26) towards the photonic crystal slab (25)), resulting in much improved vertically emitted output.

FIG. 3 shows a schematic diagram illustrating an application of the embodiment of FIGS. 2A-B when used as an optically pumped laser (350). A photonic crystal slab (35) is also shown in FIG. 3. The photonic crystal slab (35) comprises a gain medium (not shown). Throughout the present disclosure, the term 'gain medium' intends to indicate the source of optical gain within a laser. A pump laser (not shown) emits light, shown with an arrow (360), to create carriers (e.g., electron-hole pairs) within the gain medium. Some carriers will then generate photons (e.g., recombination of electron-hole pairs), thus providing an optical gain for the laser (350). Emitted light (370) emerging from the defect region (32) is also shown in FIG. 3. According to an embodiment of the present disclosure the wavelength of the emitted light (370) can be larger than the pump wavelength. In another embodiment the gain medium comprises one or more layers of quantum wells or one or more layers of quantum dots.

Figure 4:
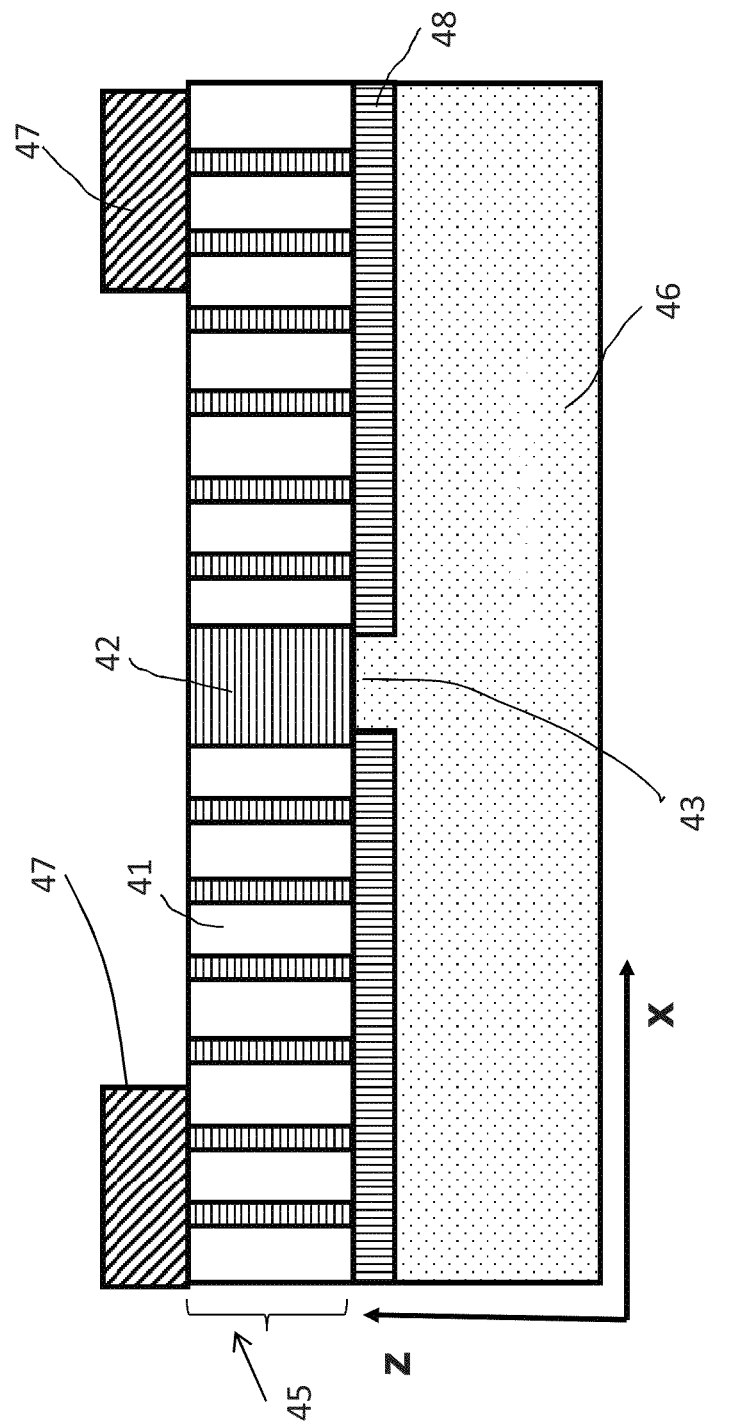
FIG. 4 shows a cross-sectional side view of an electrically-pumped photonic crystal nanocavity.

FIG. 4 shows a cross-sectional side view of an electrically-pumped photonic crystal cavity (400) in accordance with an embodiment of the present disclosure. A photonic crystal slab (45) is shown in FIG. 4. The photonic crystal slab (45) comprises a gain medium (not shown). Also shown in FIG. 4, is an electrical insulating layer (48) underlying the photonic crystal slab (45) with an aperture (43) underneath a defect region (42). The electrically-pumped photonic crystal cavity (400) can be used as part of an electrically-pumped photonic crystal laser. In other words, by applying a voltage difference between a cladding (46) and top electrodes (47), carriers (e.g., electron-hole pairs) are generated within the gain medium. Some carriers will generate photons for light emission. The person skilled in the art will appreciate that the electrical insulating layer (48) help providing an improved carrier confinement by partially insulating the cladding (46) from the photonic crystal slab (45) and guiding the generated carriers to the defect region (42) and the gain medium. This results in a better laser efficiency in the applications where the electrically-pumped photonic crystal cavity (400) is used as a laser. According to some embodiments of the present disclosure, the gain medium comprises one or more layers of quantum wells or one or more layers of quantum dots.

Figure 5A:
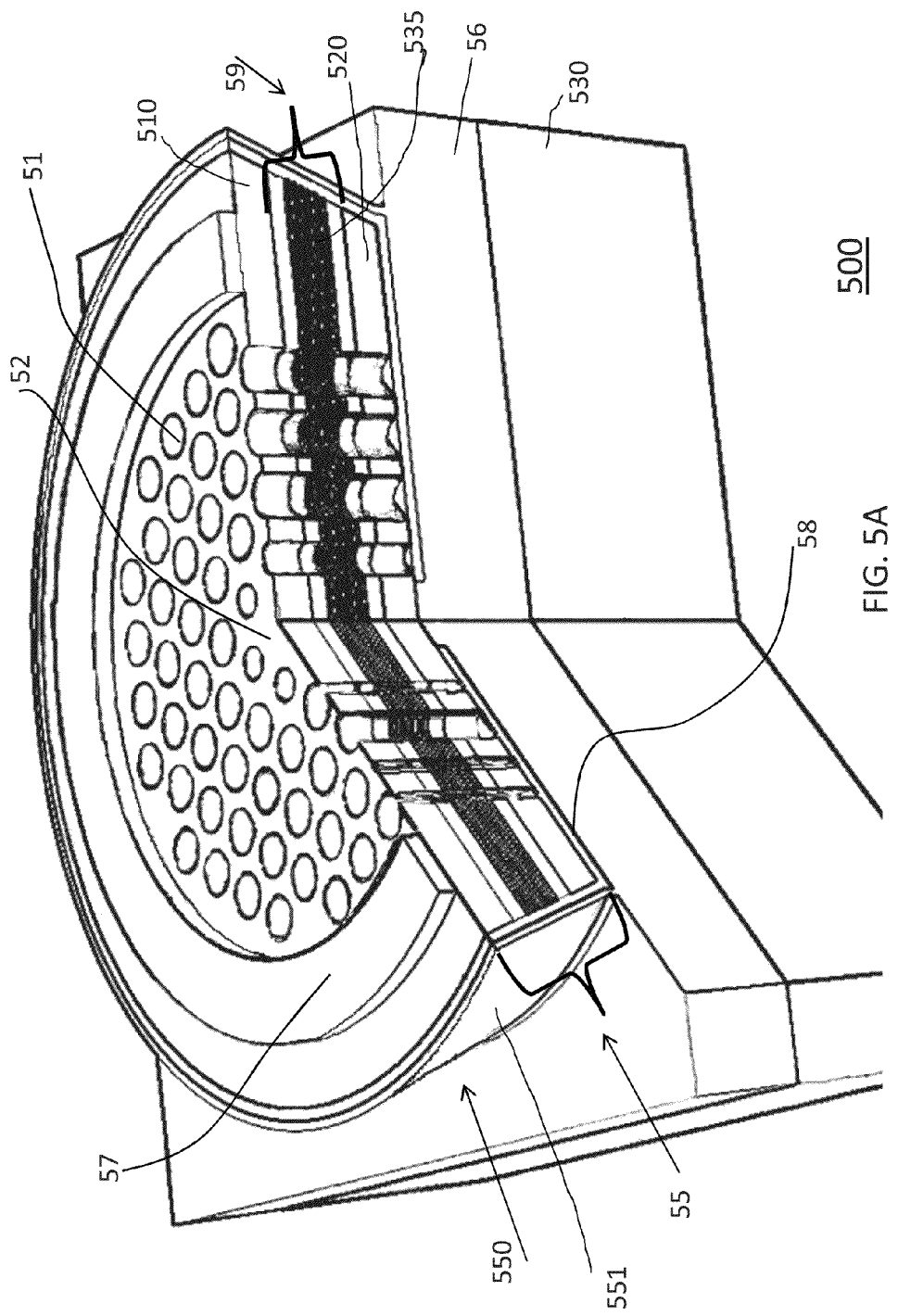
FIGS. 5A-C show respectively an exploded view, a cross-sectional side view, and a top view of a photonic crystal vertical emitting cavity.
Figure 5B:
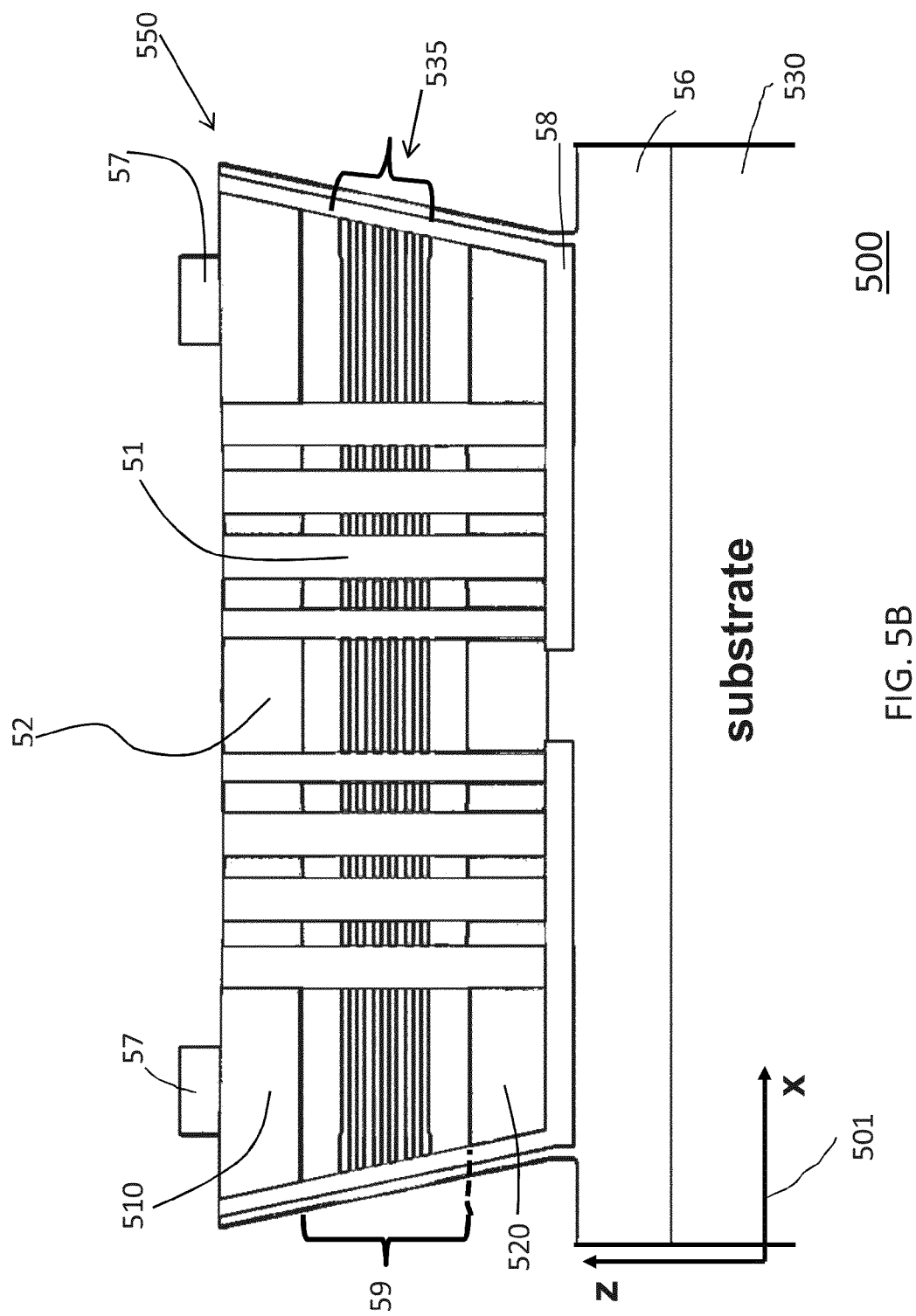
Figure 5C:
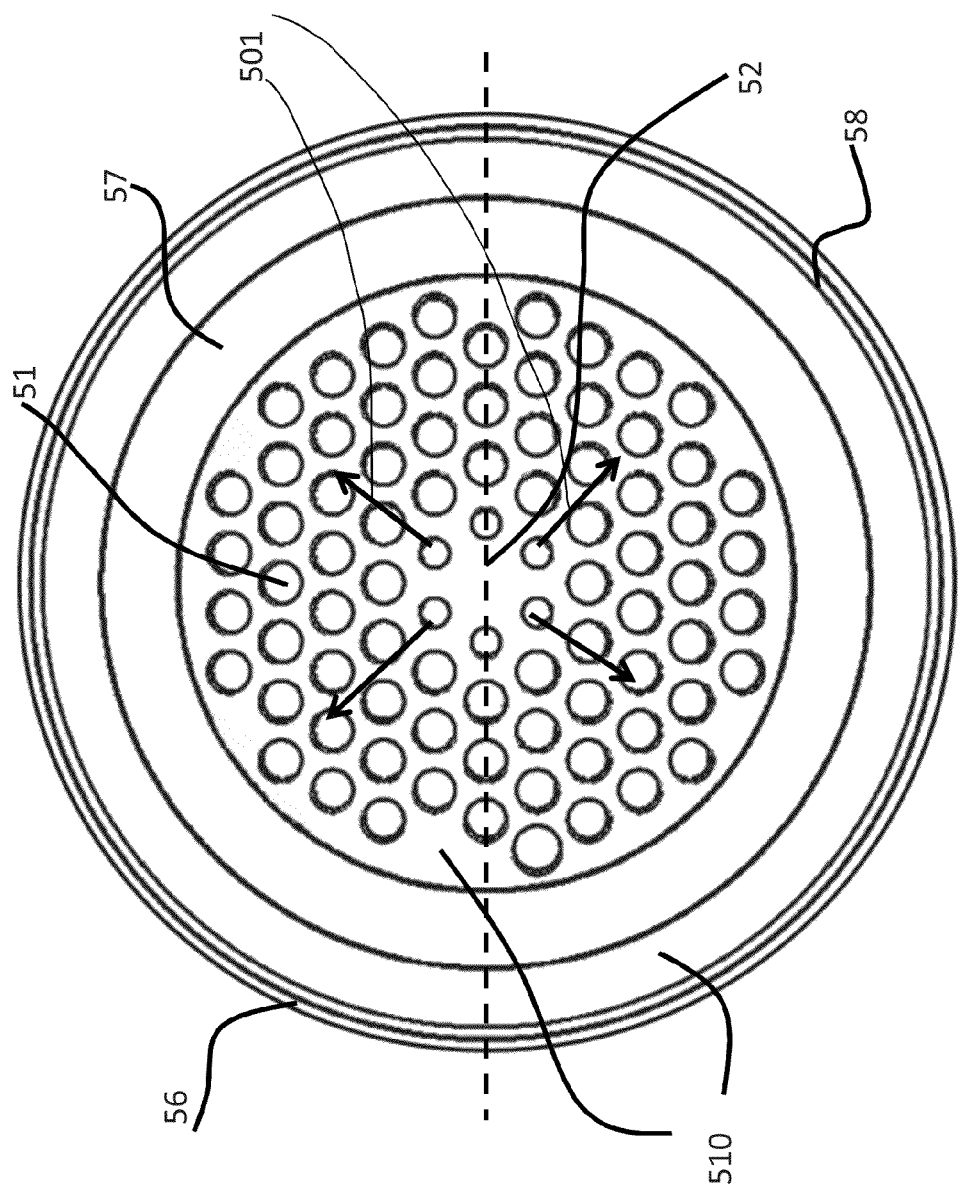

FIGS. 5A-C show respectively a partial perspective view, a cross-sectional side view, and a top view of a photonic crystal vertical emitting cavity (500) in accordance with an embodiment of the present disclosure. When used as a laser, the photonic crystal vertical emitting cavity (500) can be operated by electrical pumping. The photonic crystal vertical emitting cavity (500) comprises a mesa (550) overlying a cladding (56) sandwiched between the mesa (550) and a substrate (530). The mesa (550) comprises a multilayer photonic crystal slab (55) with a plurality of air-holes (51) and a defect region (52). A top electrode (57) overlying the photonic crystal slab (55) is also shown in FIGS. 5. A-C. Further shown in FIGS. 5A-C is an electrical insulating layer (58) partially isolating the cladding (56) from the photonic crystal slab (55) and thus improving a carrier confinement within the defect region (52). According to an embodiment of the present disclosure, the electrical insulating layer (58) can be made of an oxide with a thickness of approximately 10 nm. In another embodiment, the substrate (530) is made of silicon, however, the person skilled in the art will understand that any choice of material may be adopted as a substrate.

Referring to FIGS. 5A-B, the photonic crystal slab (55) comprises a bottom layer (520), a top layer (510) and a middle layer (59) comprising quantum wells (535) according to an embodiment of the present disclosure. In some embodiments, the quantum wells (535) are made of multi-layer of materials with different electronic bandgaps. In another embodiment, the photonic crystal slab comprises n-i-p (n-doped, intrinsic, p-doped) doping structures, in which multiple quantum wells and their barriers are undoped while the bottom layer (520) is p-doped and the top layer (510) is n-doped. In yet another embodiment, the mesa (550) is circular and serves to isolate one cavity from another. As will be described later, referring to FIG. 5A, typical fabrication steps involving evaporation of silica and gold layers will leave a sidewall (551) of the mesa (550) coated with a thin metal mirror. As shown in FIG. 5A, the slightly angled sidewall (551) of the mesa (550) may improve a light extraction efficiency by capturing small non-negligible propagating losses in a horizontal direction, shown with arrows (501) in FIGS. 5B-C.

Figure 1B:
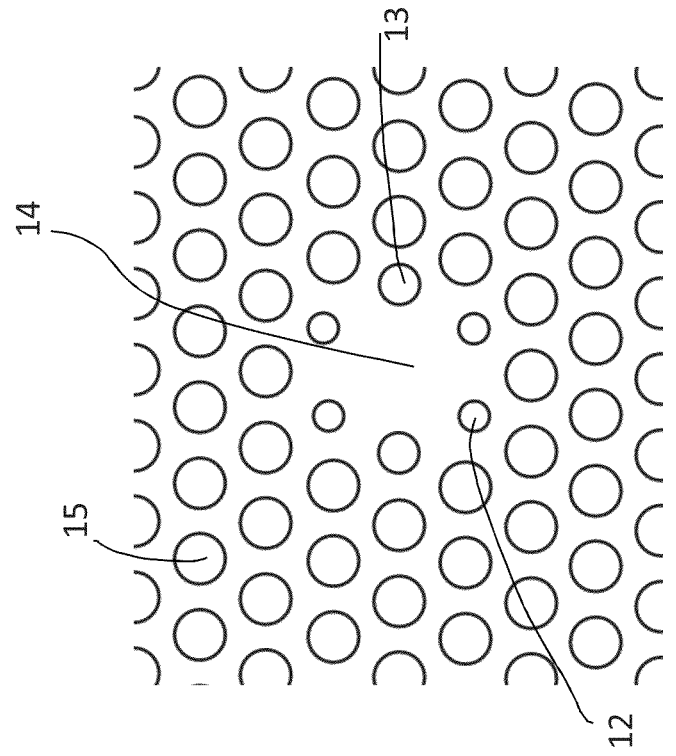
FIGS. 1A-C show top views of prior art photonic crystals.
Figure 1A:
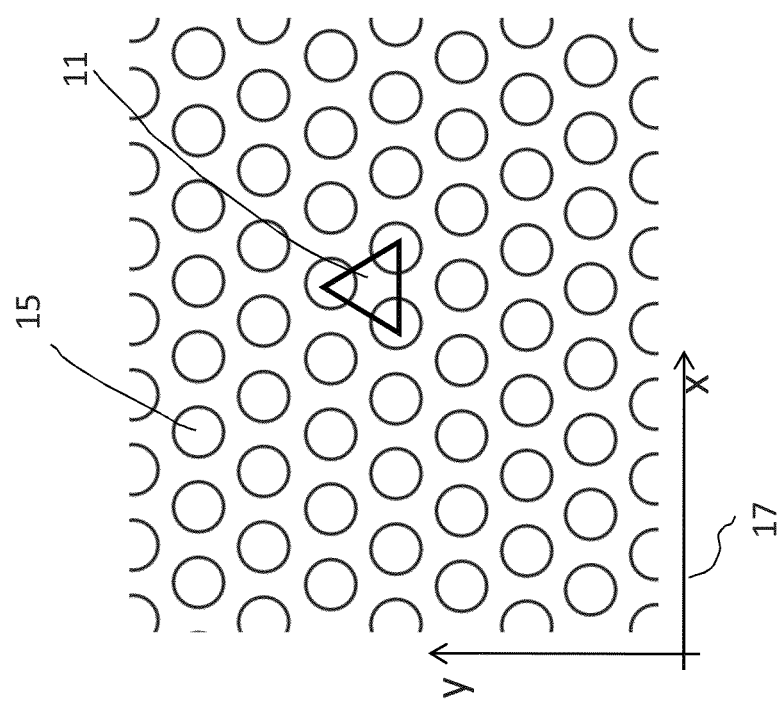
Figure 1C:
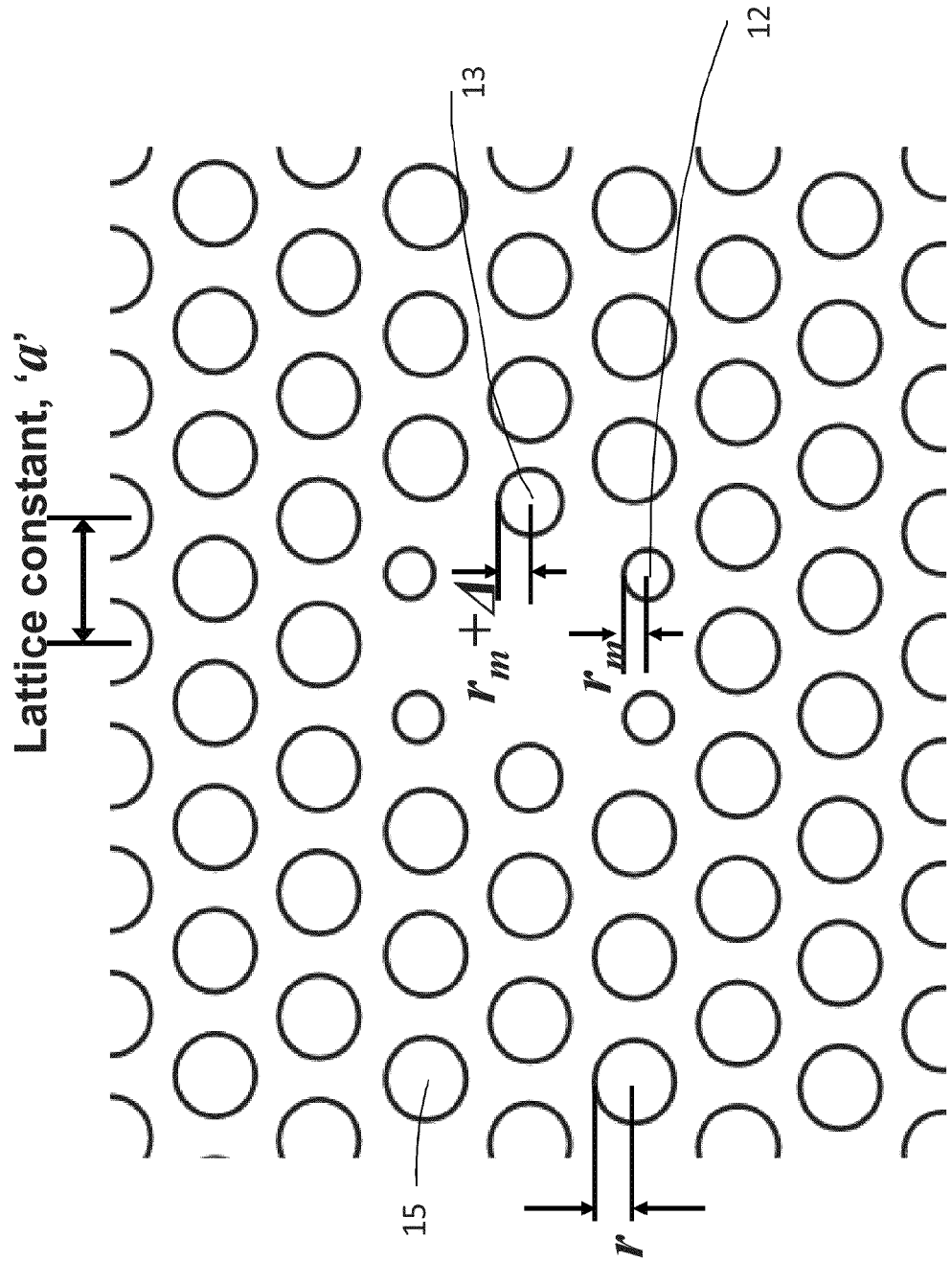
Figure 6:
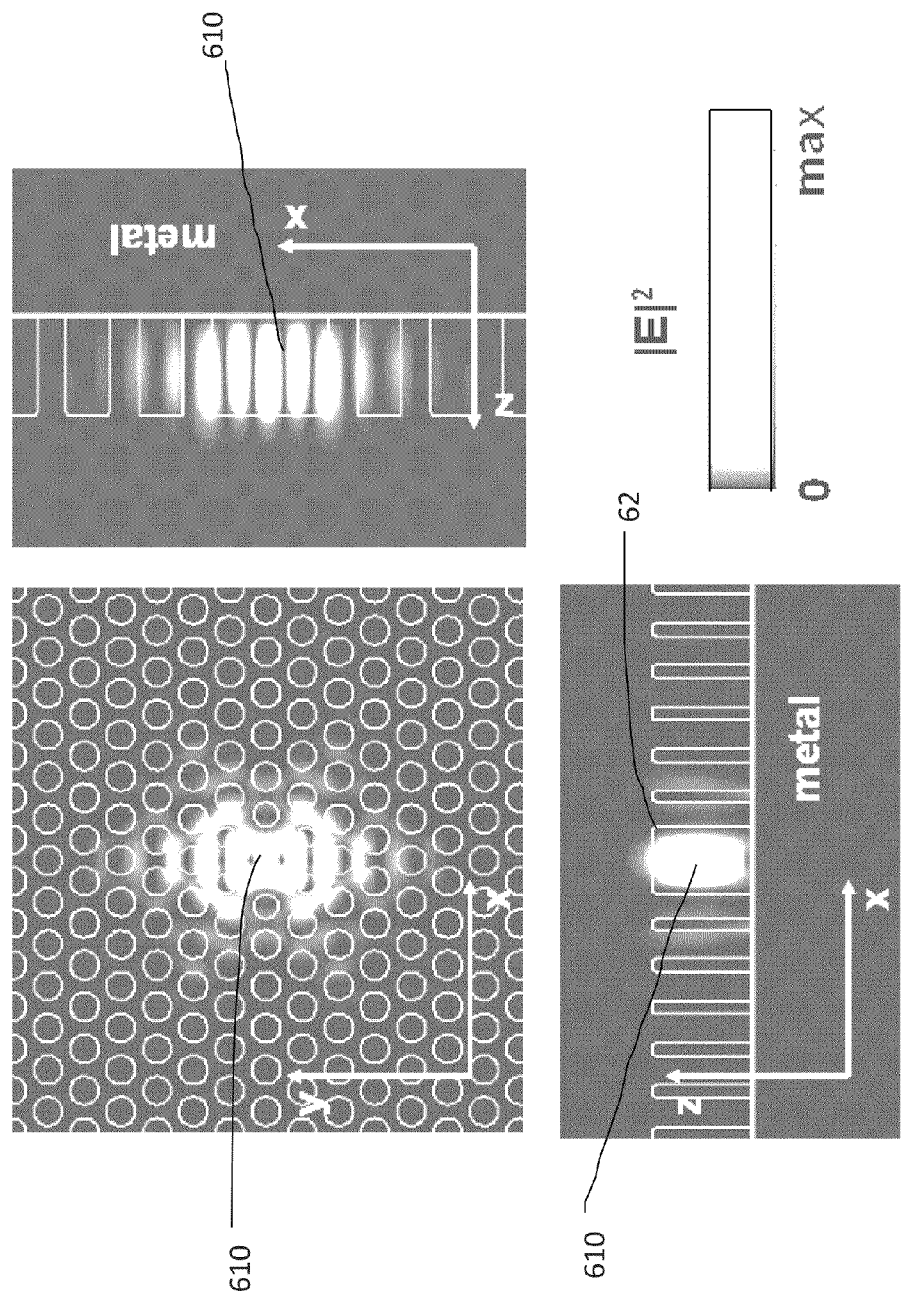
FIG. 6 shows results of three-dimensional 3D FDTD simulations related to the photonic crystal vertical emitting cavity of FIGS. 2A-B.

FIG. 6 shows results of 3D FDTD simulations related to the photonic crystal vertical emitting cavity (200 and 500) of FIGS. 2A-B and FIGS. 5A-C when used as a laser. As shown in FIG. 6, a dipole mode (610) is strongly confined around a defect region (62). In accordance with an embodiment of the present disclosure, an optical mode volume 'V' of approximately $(\lambda/n)^3$ can be achieved, where $\lambda$ is the emission wavelength in air and n is the refractive index of a photonic crystal slab material. Throughout the present disclosure, the term 'optical mode volume' is defined as the total electromagnetic energy divided by the maximum electromagnetic energy density, where the energy density is defined as the amount of stored energy per unit volume (see, for example, reference 20). In other words, the 'optical mode volume' is an indication of how much space is occupied by the electromagnetic energy distribution of a given optical mode. In some embodiments, InGaAsP is used as photonic crystal slab material wherein a resonant wavelength of around 1.3 µm or 1.55 µm can be achieved. Embodiments can be envisaged where the thickness 'T' of the photonic crystal slab (25) of FIG. 2 and the lattice constant 'a' as shown in FIG. 1C can be chosen to be 426 nm and approximately 325 nm, respectively. The resultant Q factor and the mode volume are estimated to be approximately 560 and 0.7 $(\lambda/n)^3$, respectively, enabling a Purcell factor of around 60. The Purcell factor is a figure of merit for applications including ultra-fast modulation of lasers which scales as a Q/V ratio (see, for example, references 10-12). A Purcell factor of 60 is large enough to observe various cavity quantum electrodynamics (cQED) effects (see, for example, reference 11).

Figure 7:
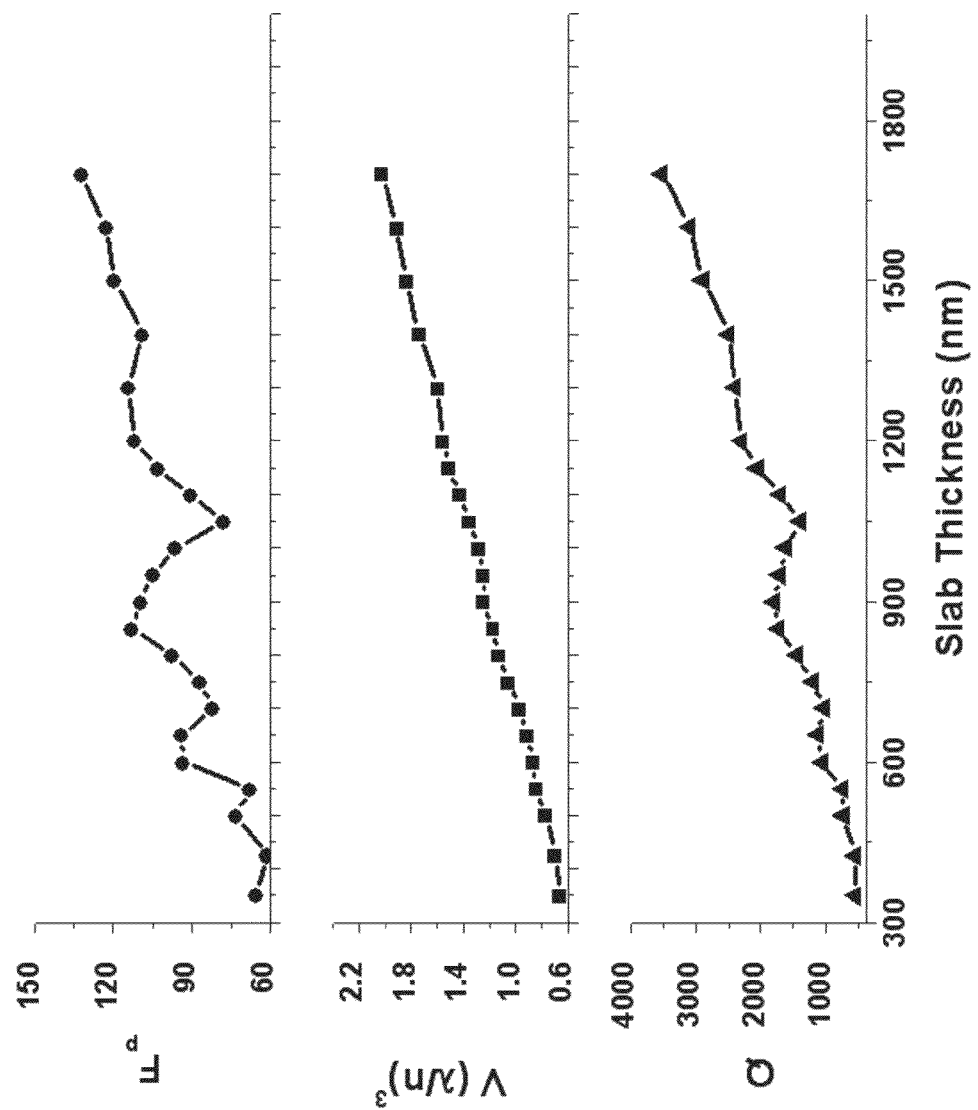
FIG. 7 shows three important characteristics of a dipole mode.

FIG. 7 shows three important characteristics of the dipole mode (610) of FIG. 6. The quality factor Q, the mode volume V, and the Purcell factor $F_p$, as a function of the slab thickness T are plotted. For different slab thinknesses, lattice constants were adjusted to keep the resulting emission wavelength constant around 1.3 µm. In order to generate the plots shown in FIG. 7, 3-D FDTD methods using auxiliary differential equations based on the Drude model (see, for example, reference 13) were implemented. With reference to FIGS. 2A-B and FIGS. 5A-B, for simulation purposes, it was assumed that the cladding (56) was made of Au and optical constants of Au at around 1.3 µm was used to implement the 3-D FDTD simulations. A moderately high Q factor in the range of approximately 1000 can be used to achieve near-thresholdless operation of a laser (see, for example, reference 14). As shown in FIG. 7, in accordance with an embodiment of the present disclosure, Q factors of the photonic crystal vertical emitting cavity (200 and 500) of FIGS. 2A-B and FIGS. 5A-C lie in a range of 1000~2000 when T is between 600 nm and 900 nm. For this embodiment, calculated mode volumes in this range are 2~3 times larger than conventional air-slab type photonic crystal cavity modes (see, for example, reference 3) due mainly to an increased slab thickness. As can further be seen in FIG. 7, moderately high Purcell factors in the range of 70 to 120, large enough to observe the cavity enhanced spontaneous emission can also be achieved.

Referring to FIGS. 2A-B and FIGS. 5A-C and the above-mentioned 3-D FDTD simulations, Applicants have found that metal absorption begins to dominate when T<350 nm. In other words, over 50% of the total emitted light will be absorbed in the cladding (56) made of a metal. At T=600 nm, metal absorption is about 30%. One can further reduce this non-radiative loss by increasing the slab thickness T. When T>1000 nm, only about 10% of the total emitted light or less will be absorbed in the cladding (56). In other words, in accordance with embodiments of the present disclosure, photonic crystal vertical emitting lasers can be designed to have quite high radiative efficiency over 70%. Throughout the present disclosure, the term 'radiation efficiency' as one minus a fraction of energy absorbed in cladding (e.g., metal) which is equivalent to a fraction of energy that will contribute to a generation of light over the total energy stored in a cavity.

Figure 8:
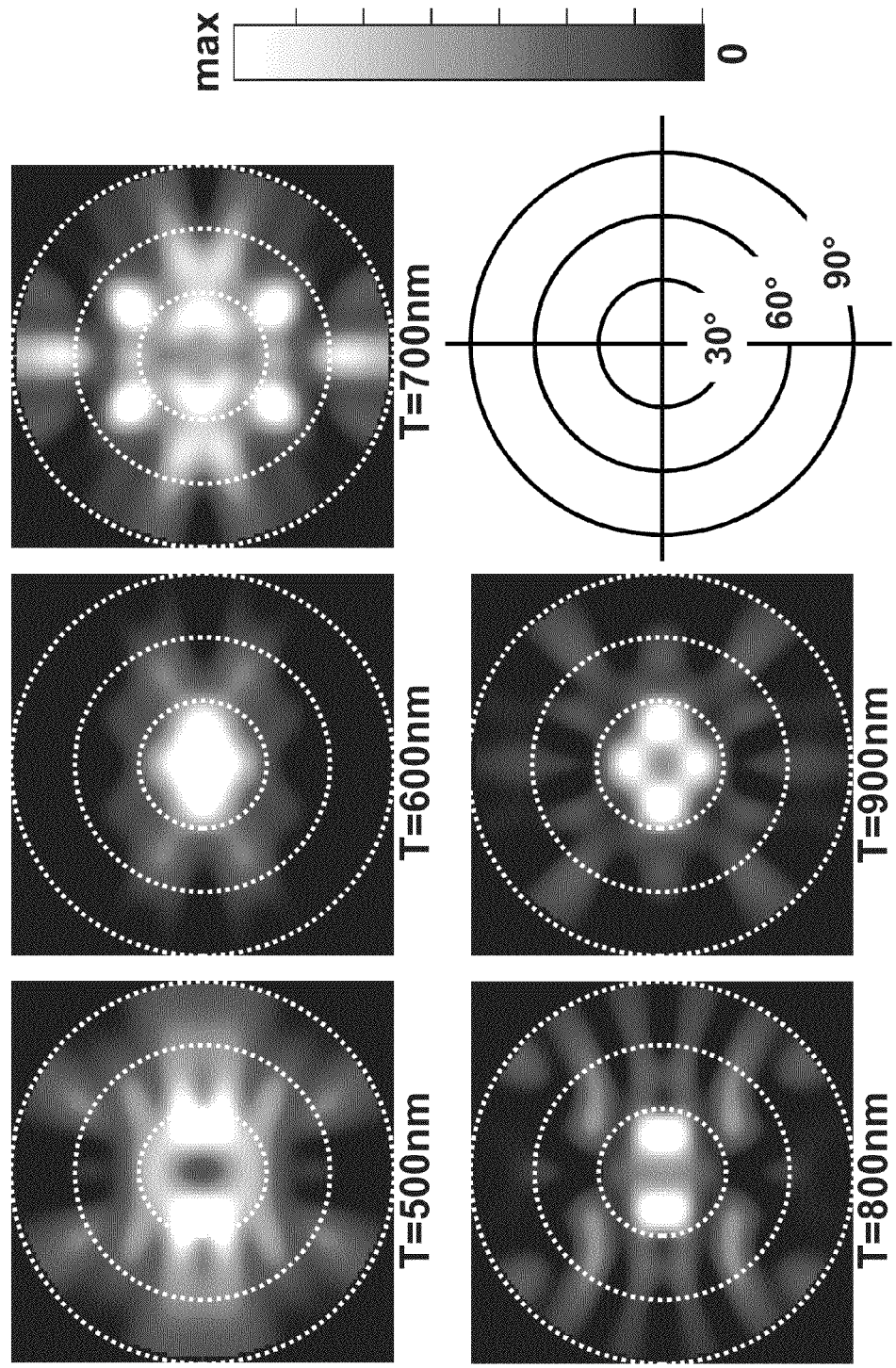
FIG. 8 shows simulated far-field emission patterns of a dipole mode.

In accordance with an embodiment of the present disclosure, FIG. 8 shows simulated far-field emission patterns of the dipole mode (610) of FIG. 6 as a function of the slab thickness 'T'. As can be seen in FIG. 8, a degree of vertical directionality varies with the slab thickness 'T'.

Figure 9:
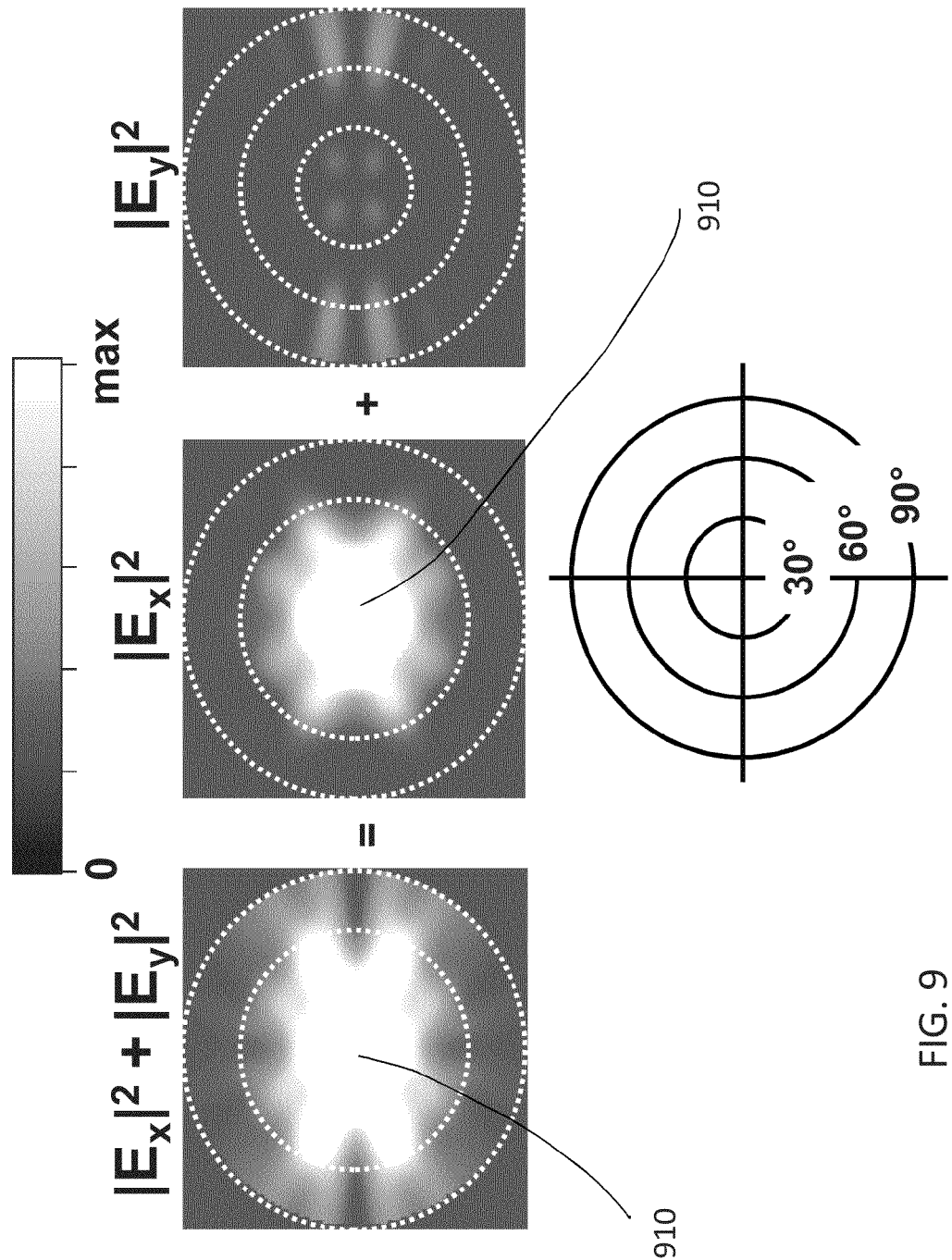
FIG. 9 shows an exemplary far-field radiation pattern of a dipole mode.

According to a further embodiment of the present disclosure, FIG. 9 shows an exemplary far-field radiation pattern of the dipole mode (610) of FIG. 6 when the slab thickness 'T' is assumed to be 600 nm. Polarization resolved far-field patterns are displayed along with the total radiation power distribution. As can be seen in FIG. 9, most of emitted light (910) power is concentrated within a small divergence angle of ±30 degrees. Furthermore, the emitted light (910) is almost linearly polarized along radial directions as shown by arrows (501) of FIGS. 5B-C. According to an embodiment of the present disclosure, a direction of the polarization is controllable by varying the radius '$r_m+\Delta$' of the two modified air-holes (13) as shown in FIG. 1C.

Figure 10:
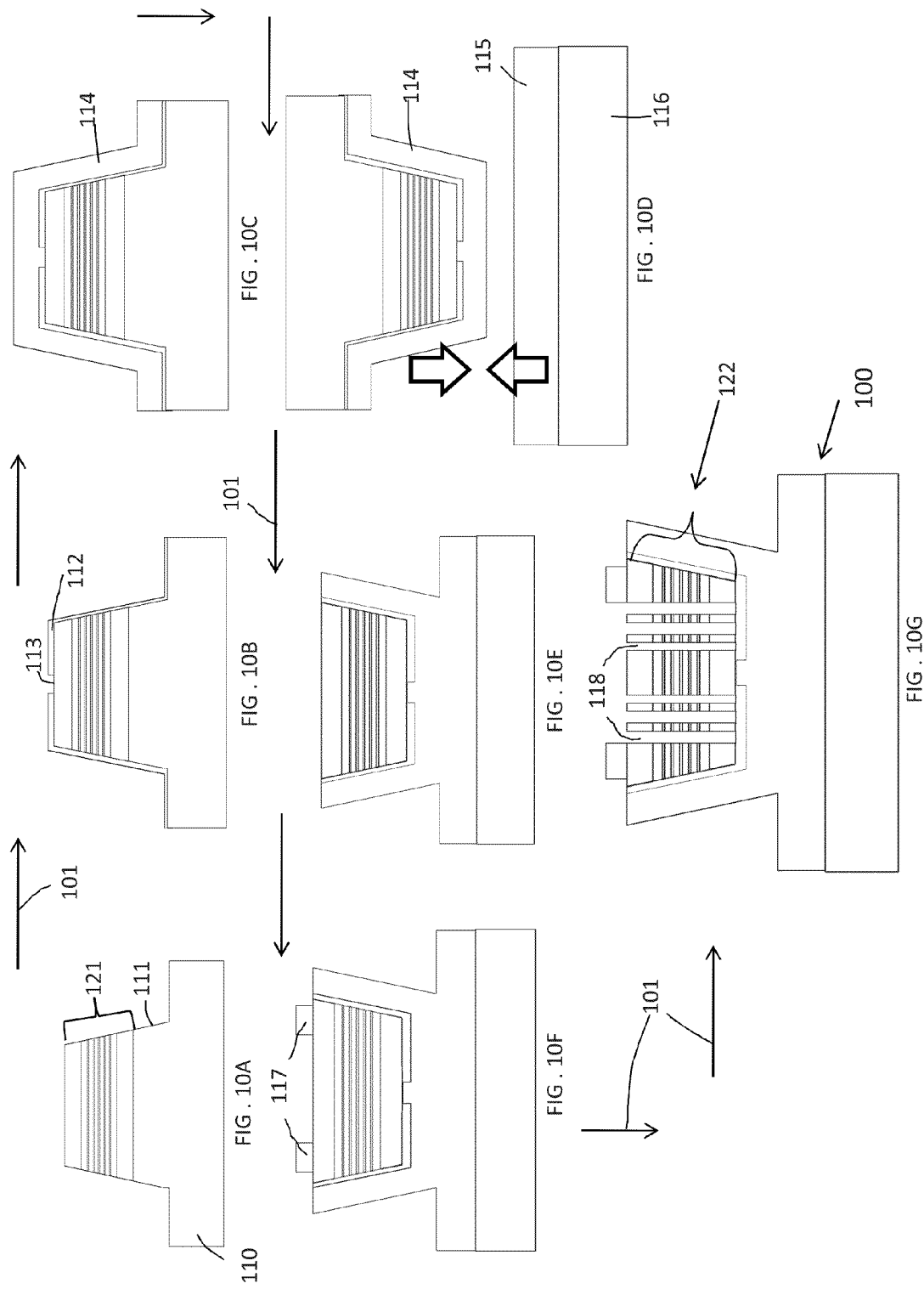
FIGS. 10A-G show a fabrication process of a photonic crystal vertical emitting cavity.

In accordance with another embodiment of the present disclosure, FIGS. 10A-G show a fabrication process of a photonic crystal vertical emitting cavity (100) by showing a cross-sectional view at each step. The direction of the arrows (101) indicates a sequence of the fabrication process. A plurality of slabs (121) are fabricated on a first substrate (110) (e.g., an InGaAsP/InP substrate). According to an embodiment of the present disclosure, the slabs (121) have each a diameter of approximately 10 µm and can be formed by dry etching processes such as inductively coupled plasma etching (ICP) with $CH_4$, $H_2$, and $Cl_2$ wherein a sidewall (111) angle can be controlled during the etching. By way of example and not of limitation, the photonic crystal slabs (120) can have a similar layer structure as the one described with reference to FIGS. 5A-C. As shown in FIG. 10B, an insulating layer (112) (e.g., oxide) having an aperture (113) above the slabs (121) is then formed. This is followed by deposition of a first top layer (114) (e.g., AuBe with a thickness of 400 nm) as shown in FIG. 10C.

Referring to FIG. 10D and continuing with the above-mentioned fabrication process, on a second substrate (116), e.g., a Si substrate, a second top layer (115), e.g., AuBe with a thickness of approximately 1 µm, is deposited. This is followed by bonding the first top layer (114) and the second top layer (115) as shown in FIG. 10D. With reference to FIG. 10E, in a subsequent step of the fabrication process, the first substrate (110) is partially removed, for example by HCl wet chemical etching. Top electrodes (117) are then formed, e.g., using a lift-off process. Referring to FIG. 10A and FIG. 10G, a photonic crystal cavity slab (122) patterns are then defined and this is followed by etching to define air-holes (118). By way of example and not of limitation, patterning can be performed using electron beam lithography and the etching can be a dry etching. The person skilled in the art will understand that the fabrication method shown in FIGS. 10A-G can be performed in more or less steps than shown in these figures.

Figure 11:
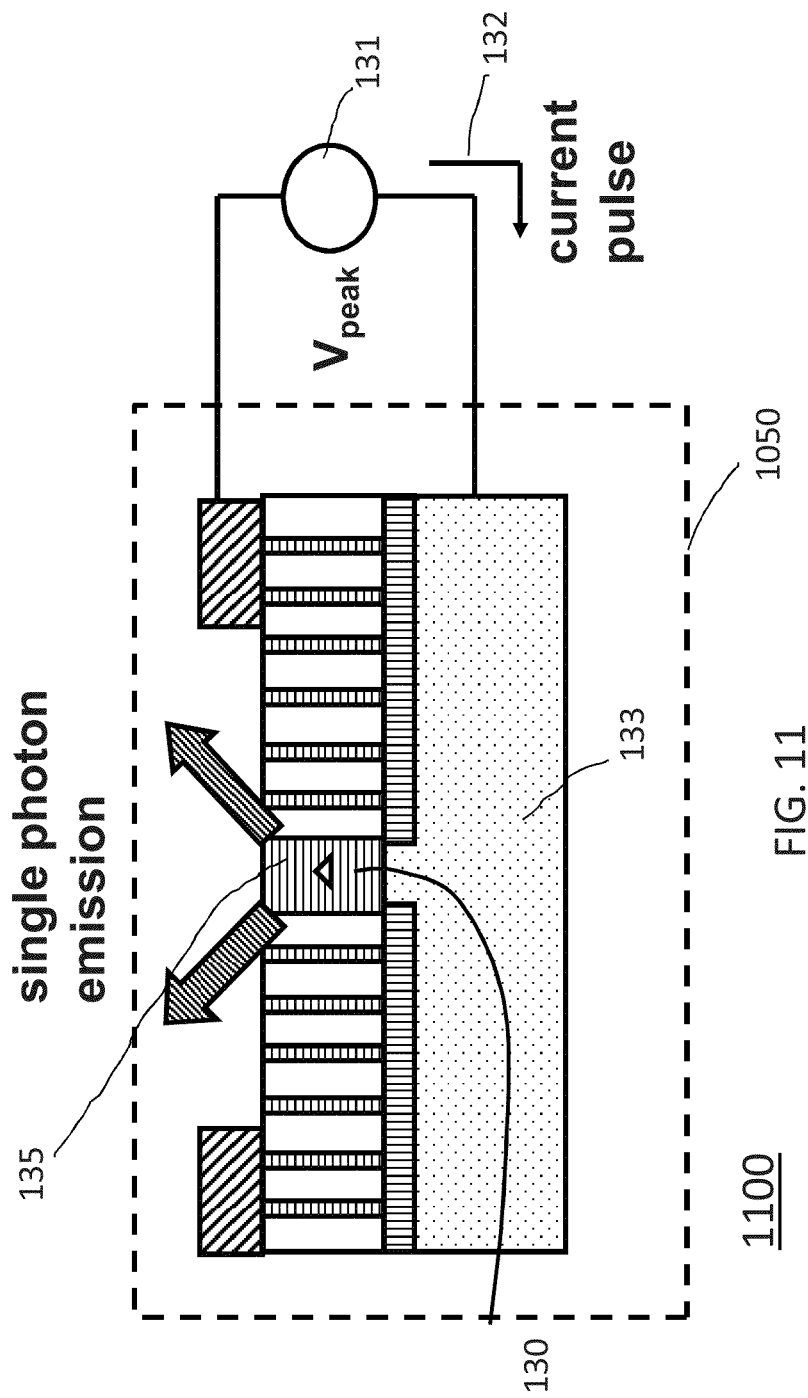
FIG. 11 shows a schematic diagram of a single photon source according to an embodiment of the present disclosure.

FIG. 11 shows a schematic diagram of a single photon source (1100) (see, for example, reference 11). The single photon source (1100) comprises an electrically-pumped photonic crystal cavity (1050) which is substantially similar to the photonic electrically-pumped photonic crystal cavity (400) of FIG. 4 except for a single quantum dot (130) located within a defect region (135). A current (132) supplied by an external source (131) is used to excite one electron-hole pair of the single quantum dot (130), which will recombine together to emit one single photon. The defect region (135) is used to efficiently capture the electro-hole pair and to emit the resulting photon from the quantum dot (130). A cladding (133) is also shown in FIG. 11. In accordance with an embodiment of the present disclosure, the cladding (133) is made of metal resulting in an enhanced directivity of a single photon emission due to high reflectivity of metal. According to a further embodiment of the present disclosure, the single photon source (1100) comprises one or more quantum dots. The person skilled in the art will understand that, the method of generating carriers described with reference to FIG. 3, i.e. optical pumping can also be used to generate carriers for the single photon source (1100).

Figure 12:
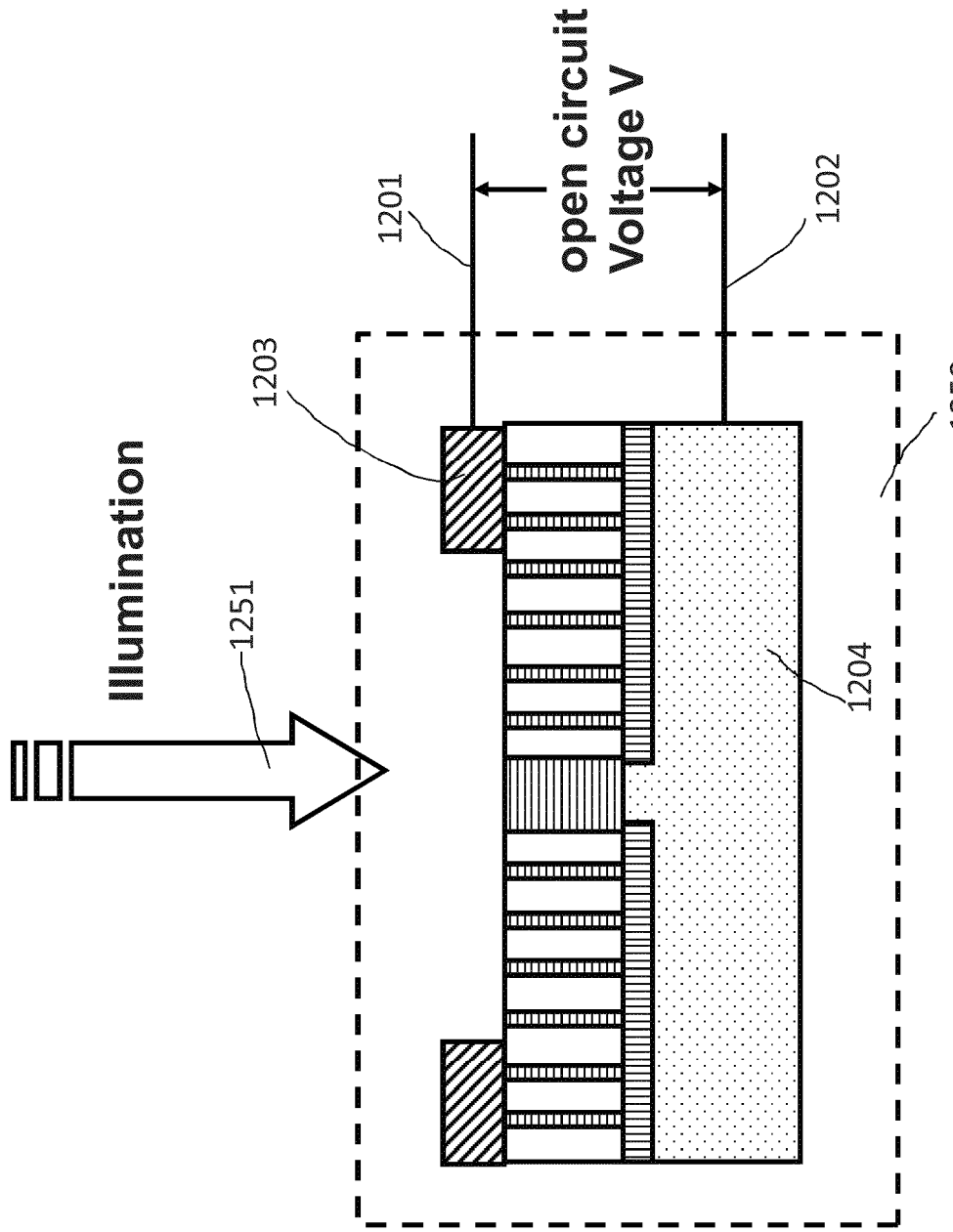
FIG. 12 shows a photovoltaic device according to an embodiment of the present disclosure.

FIG. 12 shows a photovoltaic device (1200) according to yet another embodiment of the present disclosure. The photovoltaic device (1200) comprises a photonic crystal cavity (1250) substantially similar to the electrically-pumped photonic crystal cavity (400) of FIG. 4 and two terminals (1201, 1202) connected with a top electrode (1203) and a cladding (1204) respectively. During operation, an open circuit voltage V across the two terminals (1201, 1202) is generated by illuminating light (1251) on the photovoltaic device (1200) as shown in FIG. 12. By way of example and not of limitation, the illumination light (1251) can be either white light or monochromatic light. Light energy can be converted into electrical or mechanical works by attaching a load resistance (not shown) between the two terminals (1201, 1202). According to an embodiment of the present disclosure, a power within the μW range can be generated by the photovoltaic device (1200).

All references cited throughout the present disclosure are incorporated herein by reference in their entirety.

The present disclosure has shown photonic crystal cavities and related devices and fabrication methods. While photonic crystal cavities and related applications have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

LIST OF REFERENCES

1. S. G. Johnson, S. Fan, P. R. Villeneuve, J. D. Joannopoulos, L. A. Kolodziejski, "Guided modes in photonic crystal slabs," Phys. Rev. B, vol. 60, 5751 (1999).
2. O. Painter, R. K. Lee, A. Scherer, A. Yariv, J. D. O'Brien, P. D. Dapkus, I. Kim, "Two-dimensional photonic bandgap defect mode laser," Science, vol. 284, 1819 (1999).
3. H.-G. Park, J.-K. Hwang, J. Huh, H.-Y. Ryu, S.-H. Kim, J.-S. Kim, Y.-H. Lee, "Characteristics of modified single-defect two-dimensional photonic crystal lasers," IEEE J. Quantum Electron., vol. 38, 1353 (2002).
4. P. R. Villeneuve, S. Fan, J. D. Joannopoulos, "Microcavities in photonic crystals: Mode symmetry, tunability, and coupling efficiency," Phys. Rev. B, vol. 54, 7837 (1996).
5. S.-H. Kim, S.-K. Kim, Y.-H. Lee, "Vertical beaming of wavelength-scale photonic crystal resonators," Phys. Rev. B, vol. 73, 235117 (2006).
6. K. Srinivasan, O. Painter, "Momentum space design of high-Q photonic crystal optical cavities," Opt. Express, vol. 10, 670 (2002).
7. S. H. Kim, J.-H. Choi, S.-K. Lee, S.-H. Kim, S.-M. Yang, Y.-H. Lee, C. Seassal, P. Regrency, P. Viktorovitch, "Optofluidic integration of a photonic crystal nanolaser," Opt. Express, vol. 16, 6515 (2008).
8. M. H. Shih, Y.-C. Yang, Y.-C. Liu, Z.-C. Chang, K.-S. Hsu, M. C. Wu, "Room temperature continuous wave operation and characterization of photonic crystal nanolaser on a sapphire substrate," J. Phys. D : Appl. Phys., vol. 42, 105113 (2009).
9. H.-G. Park, S-H. Kim, S.-H. Kwon, Y.-G. Ju, J.-K. Yang, J.-H. Baek, S.-B. Kim, Y.-H. Lee, "Electrically driven single-cell photonic crystal laser," Science, vol. 305, 1444 (2004).
10. H. Altug, D. Englund, J. Vuckovic, "Ultrafast photonic crystal nanocavity laser," Nature Physics, vol. 2, 484 (2006).
11. D. Englund, D. Fattal, E. Waks, G. Solomon, B. Zhang, T. Nakaoka, Y. Arakawa, Y. Yamamoto, J. Vuckovic, "Controlling the spontaneous emission rate of single quantum dots in a two-dimensional photonic crystal," Phys. Rev. Lett., vol. 95, 013904 (2005).
12. S. Noda, "Seeking the ultimate nanolaser," Science, vol. 314, 260 (2006).
13. A. Taflove and S. C. Hagness, *Computational Electrodynamics: The Finite-Difference Time-Domain Method*, 2nd ed. (Artech House, Norwood, Mass., 2000).
14. K. Nozaki, S. Kita, T. Baba, "Room temperature continuous wave operation and controlled spontaneous emission in ultrasmall photonic crystal nanolaser," Opt. Express, vol. 15, 7506 (2007).
15. M. Hill, Y.-S. Oei, B. Samlbrugge, Y. Zhu, T. D. Vries, P. J. V. Veldhoven, F. W. M. V. Otten, T. J. Eljkemans, J. P. Turkiewicz, H. D. Waardt, E. J. Geluk, S.-H. Kwon, Y.-H. Lee, R. Notzel, M. K. Smit, "Lasing in metallic-coated nanocavities," Nature Photon. vol. 1, 589 (2007).
16. B. Min, E. Ostby, V. Sorger, E. Ulin-Avila, L. Yang, X. Zhang, K. Vahala, "High-Q surface-plasmon-polariton whispering-gallery microcavity," Nature, vol. 457, 455 (2009).
17. M. Ibanescu, S. G. Johnson, D. Roundy, C. Luo, Y. Fink, J. D. Joannopoulos, "Anomalous dispersion relations by symmetry breaking in axially uniform waveguides," Phys. Rev. Lett., vol. 92, 063903 (2004).
18. Y. Takahashi, H. Hagino, Y. Tanaka, B.-S. Song, T. Asano, S. Noda, "High-Q nanocavity with a 2-ns photon lifetime," Opt. Express, vol. 15, 17206, (2007).
19. M.-K. Seo, K.-Y. Jeong, J.-K. Yang, Y.-H. Lee, H.-G. Park, S.-B. Kim, "Low threshold current single-cell hexapole mode photonic crystal laser," Appl. Phys. Lett. vol. 90, 171122, (2007).
20. S.-W. Chang, S. L. Chuang, "Fundamental formulation for plasmonic nanolasers," IEEE J. Quantum Electron., vol. 45, 1014, (2009).

The invention claimed is:

1. An optically-pumped photonic crystal laser comprising:
a pump laser; and
a photonic crystal cavity comprising:
   i) a photonic crystal slab comprising a plurality of airholes arranged periodically, a defect region, and a gain medium; and
   ii) a metal cladding underlying the photonic crystal slab, wherein, in an operative condition, the pump laser emits light onto the defect region of the photonic crystal cavity to create carriers confined in the gain medium to generate light, the light being emitted in a non-parallel direction with respect to a plane corresponding to a planar interface between the metal cladding and the photonic crystal slab, and wherein the metal cladding comprises a metal that is over 98% reflective to a wavelength of the emitted light.

2. The optically-pumped photonic crystal laser of claim 1, wherein the gain medium comprises one or more layer of quantum wells or one or more layers of quantum dots.

3. The optically-pumped photonic crystal laser of claim 2, wherein the photonic crystal slab further comprises:
   a top layer;
   a middle layer; and
   a bottom layer,
   wherein
   the one or more layers of quantum wells or the one or more layers of quantum dots are embedded within the middle layer.

4. A single photon source comprising:
   a photonic crystal cavity comprising:
      i) a photonic crystal slab comprising a plurality of airholes arranged periodically and a defect region;
      ii) a metal cladding underlying the photonic crystal slab; and
      iii) a quantum dot within the defect region, and
   a current source, wherein, during operation, a current supplied by the current source excites one electron-hole pair from the quantum dot, the electron-hole pair recombining and generating a single photon,
   wherein the photonic crystal cavity and current source are configured such that, during operation, the single photon generated on the photonic crystal cavity is emitted in a non-parallel direction from the defect region with respect to a planar interface between the photonic crystal slab and the metal cladding underlying the photonic crystal slab, and wherein the metal cladding comprises a metal that is over 98% reflective to a wavelength of the single photon.

5. The single photon source of claim 4, further comprising a pulse generator connected with a top electrode overlying the photonic crystal slab and the metal cladding, wherein an emission of the single photon is electrically triggered by the pulse generator.

6. The optically-pumped photonic crystal laser of claim 1, wherein the light generated has a wavelength greater than a wavelength associated with the light from the pump laser used to create the carriers.

\* \* \* \* \*